United States Patent
Numano et al.

(12) 
(10) Patent No.: US 6,222,252 B1
(45) Date of Patent: Apr. 24, 2001

(54) SEMICONDUCTOR SUBSTRATE AND METHOD FOR PRODUCING THE SAME

(75) Inventors: Masanori Numano, Oita; Moriya Miyashita, Yokkaichi, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/069,146

(22) Filed: Apr. 29, 1998

(30) Foreign Application Priority Data

Apr. 30, 1997 (JP) .................................................. 9-112696

(51) Int. Cl.⁷ .................................................. H01L 29/30
(52) U.S. Cl. .............................. 257/617; 257/611; 257/913
(58) Field of Search ................................... 257/617, 611, 257/913; 438/473, 474

(56) References Cited

U.S. PATENT DOCUMENTS 5,994,761 * 11/1999 Falster et al. ........................ 257/611

OTHER PUBLICATIONS

Wolf, Stanley, et al., Silicon Processing for the VLSE Era, Lattice Press, pp. 54 and 59–70, 1986.*

* cited by examiner

Primary Examiner—Sara Crane
(74) Attorney, Agent, or Firm—Oblon, Spivak, McClelland, Maier & Neustadt, P.C.

(57) ABSTRACT

A semiconductor substrate is provided which can efficiently exhibit intrinsic gettering (IG) effect, is less likely to cause slipping or dislocation, and causes no significant lowering in mechanical strength. The semiconductor substrate has bulk micro defects dispersed at a density of not less than $10^{11}$ micro defects/cm³ in the interior thereof.

7 Claims, 4 Drawing Sheets

SEMICONDUCTOR SUBSTRATE AND METHOD FOR PRODUCING THE SAME

BACKGROUND OF THE INVENTION

The present invention relates to a semiconductor substrate and a process for producing the same. More particularly, the present invention relates to a semiconductor substrate for use in memory devices and logic devices having an MOS structure, an MOS semiconductor device, and a process for producing the same.

A CZ (Czochralski) silicon substrate taken off from a single crystal silicon grown by the Czochralski method (CZ method) has hitherto been mainly used as a silicon wafer which serves as a substrate for a semiconductor device. Further, an epitaxial wafer prepared by forming a single crystal silicon layer on a CZ silicon substrate by vapor phase epitaxy has also been used as the semiconductor substrate.

When a device having an MOS structure is prepared using the silicon substrate, oxygen contained in the semiconductor substrate is precipitated by heat treatment in the course of the production process, forming precipitation of oxygen, i.e., bulk micro defects (BMD). These bulk micro defects formed in the semiconductor substrate can incorporate therein metal impurities. Therefore, the effect of eliminating electrical failure and the like attributable to metal impurities in the course of device formation, that is, IG (intrinsic gettering) effect (hereinafter often referred to as "gettering effect"), can be expected. Basically, the higher the density of bulk micro defects, the better the IG effect. In order to efficiently attain the IG effect, it is generally considered that the density of bulk micro defects should be not less than $10^8$ defects/cm$^3$.

Formation of bulk micro defects in the semiconductor substrate, however, is disadvantageous in that presence of bulk micro defects in a device forming zone is causative of electrical failure, such as poor gate silicon oxide proof voltage or junction leak failure. For this reason, a DZIG wafer, wherein the device forming zone has been brought to a denuded zone (DZ), is generally used. In this DZIG wafer, bulk micro defects are formed at a density of $10^8$ to $10^{10}$ defects/cm$^3$ in the interior of the semiconductor substrate. This bulk micro defect density of DZIG is convenient for attaining the IG effect.

When a device having an MOS structure is formed using a DZIG substrate having a bulk micro defect density of $10^8$ to $10^{10}$ defects/cm$^3$, however, slipping or dislocation is created in forming zone, resulting in deteriorated mechanical strength of the semiconductor substrate. That is, when the bulk micro defect density of the semiconductor substrate is high, the mechanical strength of the semiconductor substrate is lowered. In this case, for the semiconductor substrate alone, the lowering in mechanical strength can be reduced by controlling the mechanical strength through heat treatment in a temperature region (900° C. or above) where bulk micro defects are grown. On the other hand, when a device is formed on the semiconductor substrate, final heat treatment conditions are automatically determined by the device forming process, making it practically difficult to control the mechanical strength by heat treatment at 900° C. or above.

Thus, the IG effect and the high mechanical strength are contradictory properties, and, at the present time, it is difficult to provide a semiconductor substrate which has a good balance between these properties.

DISCLOSURE OF THE INVENTION

Accordingly, an object of the present invention is to provide a semiconductor substrate that can satisfy both IG effect and high mechanical strength requirements, which could not have simultaneously satisfied, that is, a semiconductor substrate that can efficiently exhibit the IG effect by virtue of the creation of bulk micro defects in the interior of the semiconductor device and, at the same time, is less likely to create slipping or dislocation and has excellent mechanical strength.

The present inventors have unexpectedly found that an enhancement in bulk micro defect density in terms of the number of bulk micro defects in the semiconductor substrate to a given level, which has not been found in the prior art, can significantly reduce slipping and dislocation, can enhance the mechanical strength to a satisfactory level and in addition can develop satisfactory IG effect, which has been led to the completion of the present invention.

The semiconductor substrate of the present invention which has been made based on the above finding has bulk micro defects dispersed at a density of not less than $10^{11}$ micro defects/cm$^3$ in the interior thereof.

According to a preferred embodiment of the present invention, the initial concentration of oxygen in the semiconductor substrate is not more than $9 \times 10^{17}$ atoms/cm$^3$ in terms of conversion factor IOC(international oxygen coefficient)-88, the average size of bulk micro defects present in the interior of the semiconductor substrate is not more than 300 nm, the semiconductor substrate has a resistivity of not more than 0.05 Ω·cm, the concentration of boron in the semiconductor substrate is $10^{18}$ to $10^{20}$ atoms/cm$^3$, and the semiconductor substrate has a maximum breaking shear stress of not less than 14 MPa as measured by a flexural test at a displacement speed of 0.1 mm/min according to the procedure as set forth in JIS R 1601.

According to another preferred embodiment of the present invention, the semiconductor substrate has thereon a denuded zone formed by either epitaxial growth or high-temperature annealing in a reducing atmosphere, an inert gas atmosphere, or an atmosphere of a mixed gas composed of a reducing gas and an inert gas.

According to another aspect of the present invention, there is provided an MOS type semiconductor device comprising: the above semiconductor substrate; and at least an MOS transistor or capacitor provided on the semiconductor substrate.

According to a further aspect of the present invention, there is provided a process for producing the above semiconductor substrate, comprising the steps of: heat-treating a semiconductor substrate at 450 to 800° C. for one hr or longer for nucleation; and then heat-treating the semiconductor substrate at 900 to 1100° C. for growth. According to a preferred embodiment of the present invention, a denuded zone is formed on the surface of the above semiconductor substrate by either epitaxial growth or high-temperature annealing in a reducing atmosphere, an inert gas atmosphere, or an atmosphere of a mixed gas composed of a reducing gas and an inert gas.

BEST MODE FOR CARRYING OUT THE INVENTION

Figure 1:
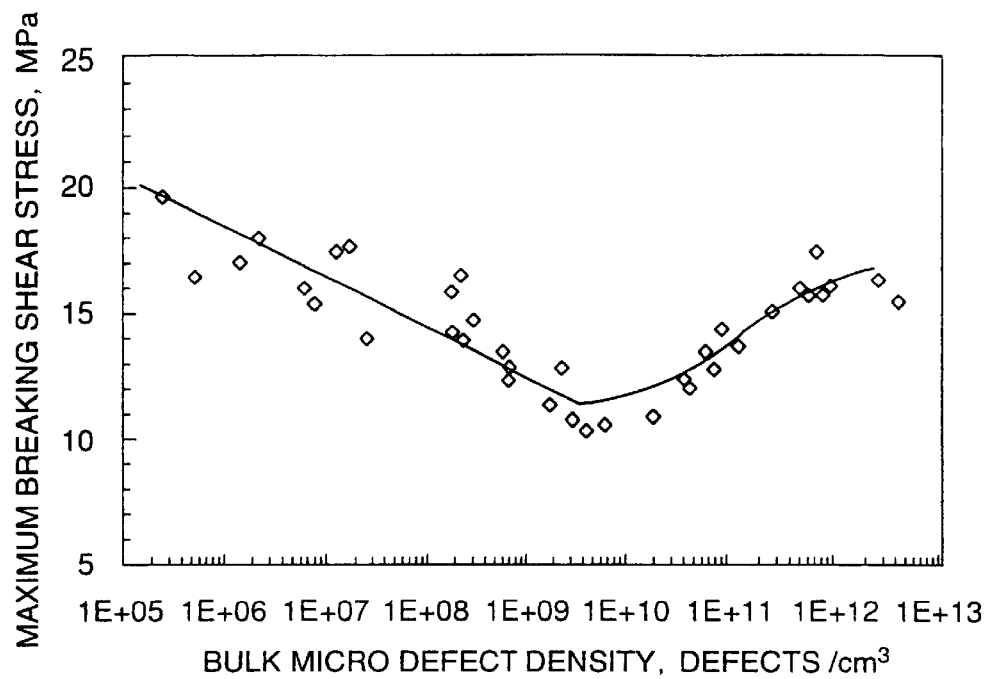
FIG. 1 is a graph showing the dependency of the maximum breaking shear stress, of a semiconductor substrate prepared in Example 1, upon bulk micro defect density.

The present invention will be described in more detail.

Bulk Micro Defect Density

The bulk micro defects develops IG effect, but on the other hand, they cause slipping and dislocation in a semiconductor substrate, resulting in deteriorated mechanical strength. This deteriorated mechanical strength is considered attributable to the creation of a strain due to volume expansion produced at the time of conversion of silicon to $SiO_2$ associated with bulk micro defects on the silicon substrate. More specifically, it is considered that when the strain is increased due to the growth of such bulk micro defects, dislocation occurs around the bulk micro defects, releasing the strain (occurrence of punch-out dislocation), which results in deteriorated mechanical strength.

The present inventors have unexpectedly found the following facts. Comparison of semiconductor substrates, which have substantially the same initial oxygen concentration and a commonly found bulk micro defect density, that is, a bulk micro defect density, in terms of the number of bulk micro defects, of $10^8$ to $10^{10}$ defects/cm$^3$, shows that the mechanical strength of the semiconductor device decreases with increasing the bulk micro defect density. However, when the bulk micro defect density exceeds the above range, the higher the bulk micro defect density, the higher the mechanical strength of the semiconductor substrate. That is, when the bulk micro defect density in terms of the number of bulk micro defects is not less than $10^{11}$ defects/cm$^3$, unexpectedly, higher bulk micro defect density provides better mechanical strength and more reduced slipping and dislocation. On the other hand, there is an upper limit on the amount of the bulk micro defect produced in the semiconductor substrate. Specifically, this upper limit is approximately $10^{16}$ defects/cm$^3$. For this reason, in the semiconductor substrate of the present invention, the bulk micro defect density is preferably $10^{11}$ to $10^{13}$ defects/cm$^3$ from the viewpoint of efficiently attaining the gettering effect and avoiding a significant lowering in mechanical strength of the semiconductor substrate. When higher mechanical strength is desired, preferably, the bulk micro defect density is increased in the above range. Thus, the bulk micro defect density in the semiconductor substrate of the present invention is preferably $10^{12}$ to $10^{13}$ defects/cm$^3$. The bulk micro defect density referred to herein is a measured value obtained by observation under a transmission electron microscope.

Initial Oxygen Concentration

Bulk micro defects in the semiconductor substrate are grown until the oxygen concentration reaches equilibrium. Therefore, when the bulk micro defect density is identical, the size of bulk micro defects after satisfactory heat treatment increases with increasing the initial oxygen concentration. The initial oxygen concentration is not particularly limited so far as it is on a general level. When the initial oxygen concentration is excessively low, it is difficult to attain satisfactory IG effect by increasing the bulk micro defect density. On the other hand, when the initial oxygen concentration is excessively high, the size of bulk micro defects is increased, resulting in deteriorated mechanical strength of the semiconductor substrate. In order to reduce the size of bulk micro defects after satisfactory heat treatment, the initial oxygen concentration is preferably not more than $9 \times 10^{17}$ atoms/cm$^3$. Therefore, according to a preferred embodiment of the present invention, the initial oxygen concentration of the semiconductor substrate is not more than $9 \times 10^{17}$ atoms/cm$^3$ in terms of conversion factor IOC(international oxygen coefficient)-88, more preferably $7 \times 10^{17}$ to $9 \times 10^{17}$ atoms/cm$^3$.

Average Size of Bulk Micro Defects

The bulk micro defects in the semiconductor substrate of the present invention, when the individual particles are fine, can reduce the occurrence of slipping and dislocation to prevent the deterioration of the mechanical strength. Further, there is a relationship between the average size of the bulk micro defects and the bulk micro defect density such that the average size of bulk micro defects decreases with increasing the number of bulk micro defects. The reason for this is considered as follows. Presence of oxygen in a supersaturated state in the semiconductor substrate is necessary for the growth of bulk micro defects. In this case, when the bulk micro defect density in terms of the number of bulk micro defects is high, the number of oxygen atoms consumed per bulk micro defect is small. According to a preferred embodiment of the present invention, the average size of bulk micro defects is not more than 300 nm, more preferably not more than 200 nm. The average size of bulk micro defects referred to herein means an average of measured size values of the longest portion of individual particles obtained by observation under a transmission electron microscope, assuming that the particles are in the form of substantially rectangular parallelopiped.

Resistivity of Semiconductor Substrate

Independently of whether the type is p-type or n-type, in general, the semiconductor substrate having low resistivity is likely to enhance the bulk micro defect density. Therefore, according to preferred embodiment of the present invention, the resistivity of the semiconductor substrate is not more than 0.05 Ω·cm, more preferably 0.001 to 0.05 Ω·cm.

Concentration of Boron (B) in Semiconductor Substrate

A p-type semiconductor substrate having high boron concentration is a semiconductor substrate that is likely to enhance the bulk micro defect density. Therefore, according to one preferred embodiment of the present invention, the content of boron in the semiconductor substrate is $10^{18}$ to $10^{20}$ atoms/cm$^3$, more preferably $10^{19}$ to $10^{20}$ atoms/cm$^3$.

Maximum Breaking Shear Stress

The semiconductor substrate of the present invention is characterized by having high mechanical strength. The maximum breaking shear stress may be mentioned as a representative index of the mechanical strength. In this case, the maximum breaking shear stress of the semiconductor substrate required for practical use is not less than 14 MPa as measured by a flexural test at a displacement speed of 0.1 mm/min according to the procedure as set forth in JIS R 1601. Therefore, the maximum breaking shear stress of the semiconductor substrate according to the present invention is preferably not less than 14 MPa, more preferably not less than 16 MPa.

Formation of Denuded Zone

As described above, in the semiconductor substrate containing bulk micro defects, preferably, the device forming zone is brought to a denuded zone. The denuded zone may be formed on the surface of the semiconductor substrate by either epitaxial growth or high-temperature annealing in a reducing atmosphere, an inert gas atmosphere, or an atmosphere of a mixed gas composed of a reducing gas and an inert gas.

MOS Semiconductor Device

There is no particular limitation on applications of the semiconductor substrate of the present invention. The semiconductor substrate, however, is suitable as an MOS semiconductor device.

Heat Treatment

Conditions for heat treatment in the production of the semiconductor substrate according to the present invention is not particularly limited. In order to produce bulk micro defects at a high density in the above range specified in the present invention, however, preferred heat treatment conditions are such that the semiconductor substrate is heat-treated at a relatively low temperature for a long period of time and then heat-treated at a high temperature to grow bulk micro defects. For example, one method for forming bulk micro defects in the density (in terms of the number of defects) range is such that the substrate is treated, in an early stage of the heat treatment, in a low temperature region (800° C. or below) for a long period of time (for example, 3 hr or longer although this treatment time varies depending upon the concentration of impurity (dopant) in the semiconductor substrate and crystal growing conditions) to form precipitation nuclei at a high density. When the above step of heat treatment at a low temperature for a long period of time exists in an early stage of the process for producing an MOS device, nuclei for precipitation of bulk micro defects can be formed by heat treatment in the course of the production process. In the other cases, preferably, low-temperature heat treatment is carried out before the step of forming a device. Accordingly, according to a preferred embodiment of the present invention, a semiconductor substrate is first heat-treated at 450 to 800° C. for one hr or longer for nucleation, more preferably at 600 to 700° C. for 3 to 48 hr for nucleation, and then heat-treated at 900 to 1100° C., more preferably at 1000° C., for growth.

EXAMPLES

In the following examples, a p$^+$CZ substrate having a boron concentration of $1\times10^{19}$ atoms/cm$^3$ in (100) crystallographic face, a p$^-$CZ substrate having a boron concentration of $5\times10^{15}$ atoms/cm$^3$ in (100) crystallographic face, and an n$^-$CZ substrate having a phosphorus concentration of $5\times10^{15}$ atoms/cm$^3$ in (100) crystallographic face were used as semiconductor substrates. The initial concentration of oxygen in the substrates was in the range of from 7 to $11\times10^{17}$ atoms/cm$^3$ (IOC-88).

Example 1

The p$^+$CZ substrate, p$^-$CZ substrate, and n$^-$CZ substrate each having an initial oxygen concentration in the range of from 8 to $10\times10^{17}$ atoms/cm$^3$ were heat-treated in an oxygen atmosphere (1) at 700° C. for 4 hr, (2) at 700° C. for 8 hr, (3) at 800° C. for 4 hr, and (4) at 800° C. for 8 hr to form nuclei for precipitation of bulk micro defects. The substrates were then heat-treated at 1000° C. for 16 hr to grow bulk micro defects. Thereafter, the treated substrates were measured for the maximum breaking shear stress (upper yield stress) at 1000° C. by a flexural test and the bulk micro defect density and size by observation under a transmission electron microscope.

FIG. 1 is a graph showing the dependency of the maximum breaking shear stress, of a semiconductor substrate prepared in Example 1, upon bulk micro defect density. As is apparent from FIG. 1, when the bulk micro defect density is not more than $10^{10}$ defects/cm$^3$, the maximum breaking shear stress decreases with increasing the bulk micro defect density.

On the other hand, as can be seen from FIG. 1, when bulk micro defect density is not less than $10^{11}$ defects/cm$^3$, the maximum breaking shear stress increases with increasing the bulk micro defect density.

Figure 2:
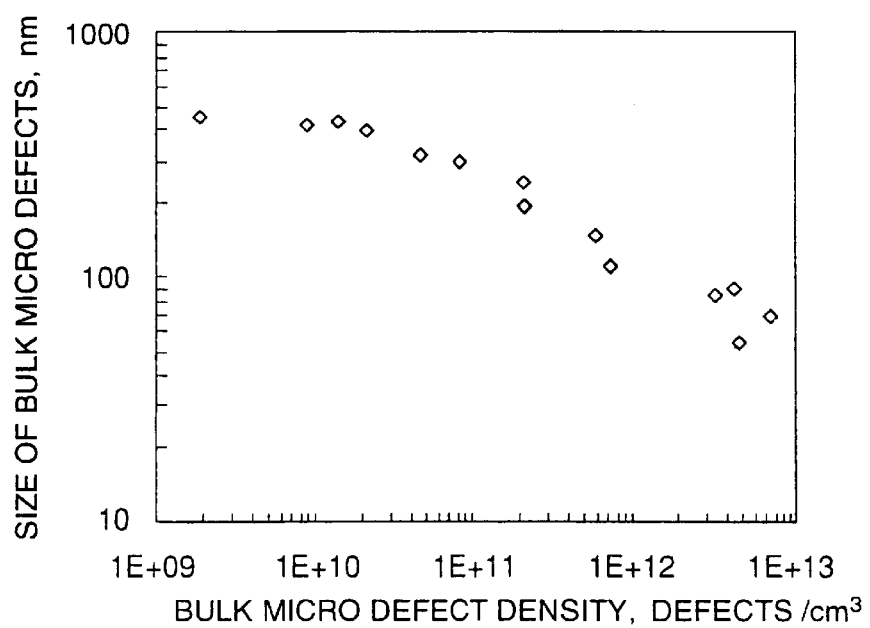
FIG. 2 is a graph showing the dependency of the size of bulk micro defects, of a semiconductor substrate prepared in Example 1, upon bulk micro defect density.

FIG. 2 is a graph showing the dependency of the size of bulk micro defects, of a semiconductor substrate prepared in Example 1, upon bulk micro defect density. As can be seen from FIG. 2, an increase in maximum breaking shear stress is considered attributable to the fact that the size of bulk micro defects decreases with increasing the bulk micro defect density. Thus, it could be confirmed that, even when the bulk micro defect density is high, the degree of a lowering in maximum breaking shear stress is small so far as the size of bulk micro defect is small.

Example 2

In this example, the relationship between the size of bulk micro defects and the maximum breaking shear stress was investigated. The p$^-$CZ substrate having an initial oxygen concentration of $10^{18}$ atoms/cm$^3$ was heat-treated in an oxygen atmosphere at 800° C. for 24 hr and then heat-treated at 1000° C. for (1) one hr, (2) 3 hr, (3) 5 hr, (4) 7 hr, (5) 9 hr, (6) 11 hr, and (7) 16 hr. The reason why the time of heat treatment at 1000° C. was varied was to grow bulk micro defects, thereby regulating the size of bulk micro defects at 1000° C. Thereafter, the maximum breaking shear stress, the bulk micro defect density, and the size of bulk micro defects were measured in the same manner as in Example 1.

Figure 3:
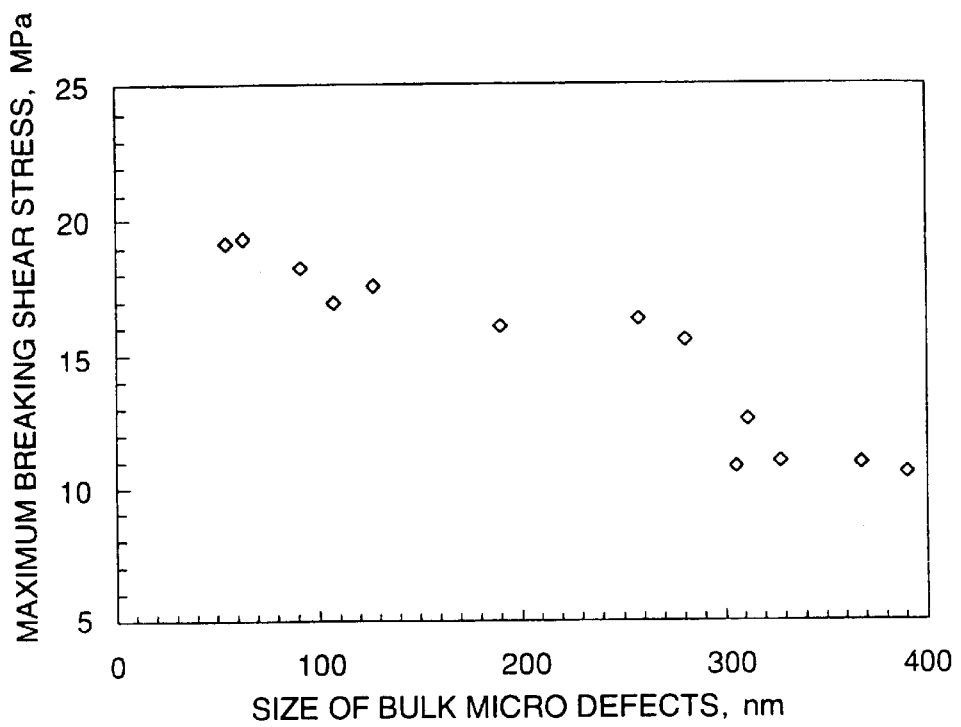
FIG. 3 is a graph showing the dependency of the maximum breaking shear stress, of a semiconductor substrate prepared in Example 2, upon the size of bulk micro defects.

FIG. 3 is a graph showing the dependency of the maximum breaking shear stress, of a semiconductor substrate prepared in Example 2, upon the size of bulk micro defects. As is apparent from FIG. 3, the maximum breaking shear stress decreases with increasing the size of bulk micro defects.

Example 3

Figure 4A:
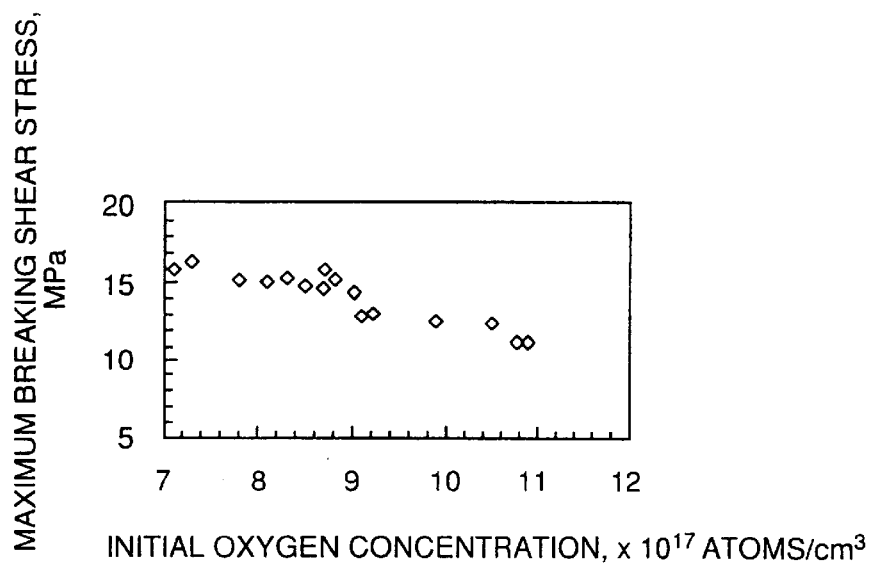
FIG. 4A is a graph showing the dependency of the maximum breaking shear stress, of a semiconductor substrate prepared in Example 3, upon oxygen concentration.
Figure 4B:
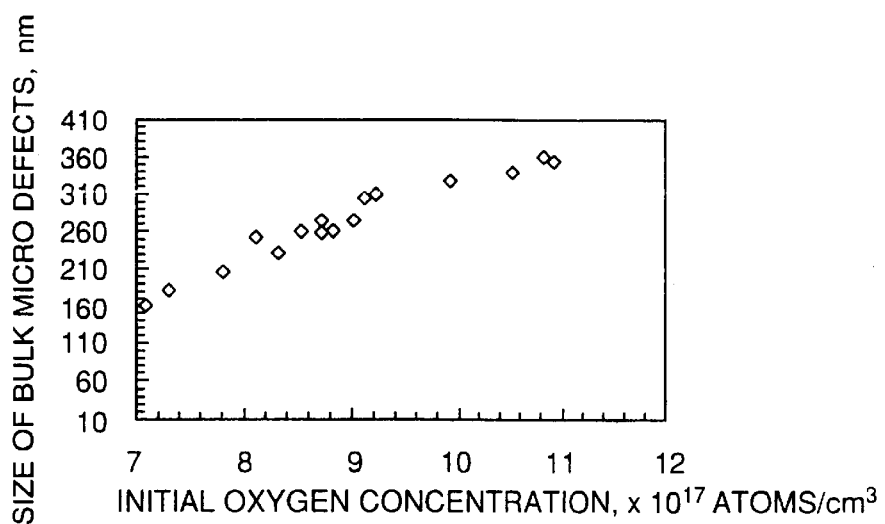
FIG. 4B is a graph showing the dependency of the size of bulk micro defects, of a semiconductor substrate prepared in Example 3, upon oxygen concentration.

In this example, p$^+$ (boron concentration: $1\times10^{19}$ atoms/cm$^3$) semiconductor substrates having an initial oxygen concentration of 7.0 to $11\times10^{17}$ atoms/cm$^3$ was heat-treated at 700° C. for 8 hr and then heat-treated at 1000° C. for 16 hr, followed by measurement of the maximum breaking shear stress and the size of bulk micro defects. The results are shown in FIGS. 4A and 4B. For the treated substrates, the bulk micro defect density was substantially identical, that is, $2\times10^{11}$ defects/cm$^3$, independently of the initial oxygen concentration. As is apparent from FIGS. 4A and 4B, the size of bulk micro defects increased with increasing the initial oxygen concentration, and, when the initial oxygen concentration was not less than $9\times10^{17}$ atoms/cm$^3$, the maximum breaking shear stress significantly lowered.

Example 4

This example demonstrates an example of the application of the semiconductor substrate according to the present invention to an actual device. Three semiconductor substrates, a p$^+$CZ substrate having an initial oxygen concentration of 8.5×10$^{17}$ atoms/cm$^3$ (Sub-1), a p$^-$CZ substrate having an initial oxygen concentration of 9×10$^{17}$ atoms/cm$^3$ (Sub-2), and a p$^-$CZ substrate having an initial oxygen concentration of 7×10$^{17}$ atoms/cm$^3$ (Sub-3) were provided. At the outset, a 5-μm p$^-$ (ρ: 1 to 2 Ω·cm) epitaxial layer (a denuded zone) was formed using SiHCl$_3$ at 1150° C. on these semiconductor substrates by vapor growth. Thereafter, heat treatment was carried out in an oxygen atmosphere at 700° C. for 3 hr to form nuclei for precipitation of bulk micro defects.

Figure 5:
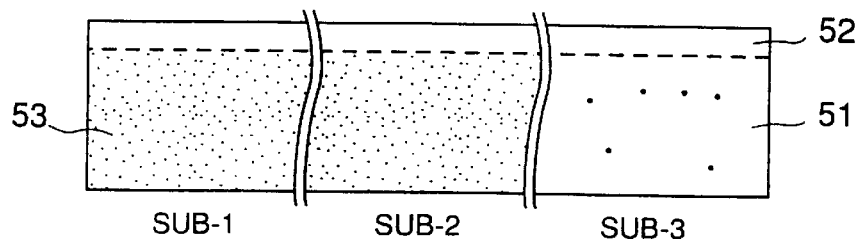
FIG. 5 is a cross-sectional view of a semiconductor substrate used in Example 4.

FIG. 5 shows a semiconductor substrate with nuclei for precipitation of bulk micro defects formed therein by the above method, wherein an epitaxial layer 52 is provided on a semiconductor substrate 51 containing bulk micro defects 53.

Figure 6:
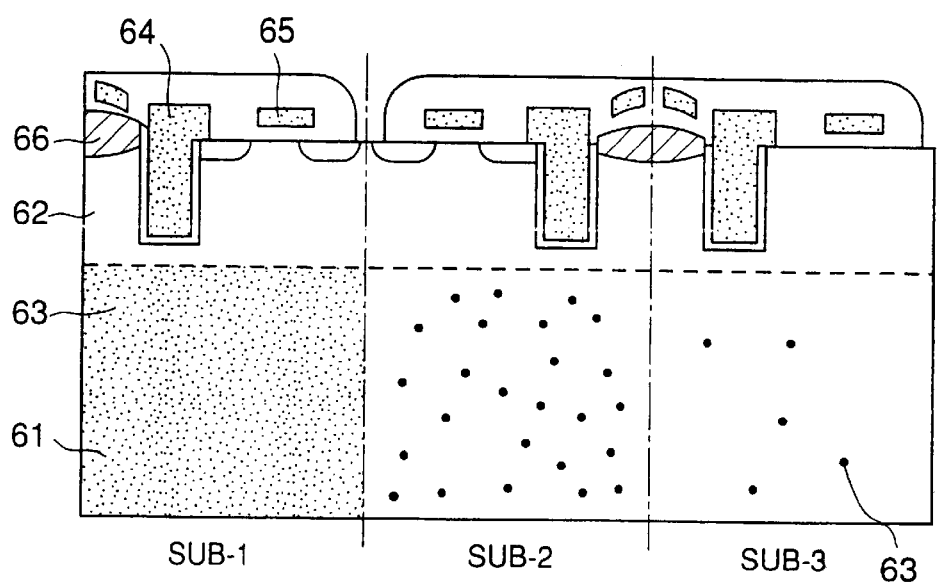
FIG. 6 is a cross-sectional view of a semiconductor substrate after the formation of a device thereon in Example 4.

FIG. 6 is a cross-sectional view of 16 Mbit CMOS DRAM formed from the semiconductor substrate shown in FIG. 5. In this CMOS DRAM, various devices, such as 1Gate Poly.Si 64, 2Gate Poly.Si 65, and Locos isolation 66, are provided in an epitaxial layer 62, formed on a semiconductor substrate 61 containing bulk micro defects 63, by the step of formation of a diffused layer, the step of isolation by localized oxidation of silicon (Locos), the step of formation of an accumulation capacitor (trench type), the step of formation of an MOS transistor, and the step of wiring. After the formation of devices, the performance test of DRAM and the evaluation of slipping, bulk micro defect density, and size of bulk micro defects were carried out. The results are summarized in Table 1.

TABLE 1

|  | Bulk micro defect density, cm$^{-3}$ | Size of bulk micro defect, nm | Slipping, % | Yield ratio* |
|---|---|---|---|---|
| Sub. 1 | 3 × 10$^{11}$ to 1 × 10$^{12}$ | 98 to 162 | 0 | 3.3 |
| Sub. 2 | 5 × 10$^8$ to 2 × 10$^9$ | 460 to 531 | 83 | 1.0 |
| Sub. 3 | 6 × 10$^6$ to 4 × 10$^7$ | 473 to 603 | 21 | 0.5 |

*: Yield of Sub. 2 was presumed to be 1.0.

Among Sub. 1 to Sub. 3, Sub. 1 is a semiconductor substrate of the present invention. For Sub. 1, both the percentage slipping and the yield were good. For Sub. 3, the yield was lowered although the percentage slipping was low. The reason for this is believed to reside in that the gettering effect could not be attained due to low bulk micro defect density. On the other hand, for Sub. 2, the yield was low although the bulk micro defect density was high enough to attain satisfactory gettering effect. The low yield is considered attributable to the creation of slipping. Thus, in order to stably provide high yield, as is apparent from Sub. 1, both satisfactory gettering effect and the effect of preventing crystal defect (dislocation) (i.e., high mechanical strength) are required. The reason why the epitaxial substrate was used in Example 4 is that the device forming layer is preferably constituted by a denuded zone.

As described above, the present invention can provide a semiconductor substrate that can offer highly efficient gettering effect by virtue of bulk micro defects and at the same time has excellent mechanical strength.

Use of the semiconductor substrate can reduce slipping at the time of heat treatment in the course of device formation. More specifically, in the formation of DRAM, the percentage slipping was about 80% for the conventional semiconductor substrate having a bulk micro defect density of 5×10$^8$ to 2×10$^9$ defects/cm$^3$, whereas slipping did not substantially occur for the semiconductor substrate of the present invention.

What is claimed is:

1. A semiconductor substrate containing bulk micro defects dispersed at a density of not less than 10$^{11}$ micro defects/cm$^3$ in the interior thereof wherein boron is present throughout the semiconductor substrate at a concentration of 10$^{18}$ to 10$^{20}$ atoms/cm$^3$.

2. The semiconductor substrate according to claim 1, wherein an initial concentration of oxygen in the semiconductor substrate is not more than 9×10$^{17}$ atoms/cm$^3$ in terms of conversion factor International Oxygen Coefficient 88.

3. The semiconductor substrate according to claim 1, wherein the average size of bulk micro defects present in the interior of the semiconductor substrate is not more than 300 nm.

4. The semiconductor substrate according to claim 1, which has a resistivity of not more than 0.05 Ω·cm.

5. The semiconductor substrate according to claim 1, which has a maximum breaking shear stress of not less than 14 MPa as measured by a flexural test at a displacement speed of 0.1 mm/min according to the procedure as set forth in Japanese Industrial Standard R 1601.

6. The semiconductor substrate according to any one of claims 1 to 4 and 5 which has thereon a denuded zone formed by either epitaxial growth or high-temperature annealing in a reducing gas atmosphere, an inert gas atmosphere, or an atmosphere of a mixed gas composed of a reducing gas and an inert gas.

7. An MOS type semiconductor device comprising: the semiconductor substrate according to any one of claims 1 to 4; and 5 and at least an MOS transistor or capacitor provided on the semiconductor substrate.

* * * * *